US009437808B2

(12) United States Patent
Doyle et al.

(10) Patent No.: US 9,437,808 B2
(45) Date of Patent: *Sep. 6, 2016

(54) ELECTRIC FIELD ENHANCED SPIN TRANSFER TORQUE MEMORY (STTM) DEVICE

(71) Applicant: Intel Corporation, Santa Clara, CA (US)

(72) Inventors: Brian S. Doyle, Portland, OR (US); Charles C. Kuo, Union City, CA (US); David L. Kencke, Beaverton, OR (US); Roksana Golizadeh Mojarad, San Jose, CA (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/887,168

(22) Filed: Oct. 19, 2015

(65) Prior Publication Data

US 2016/0043302 A1   Feb. 11, 2016

Related U.S. Application Data

(63) Continuation of application No. 13/725,235, filed on Dec. 21, 2012, now Pat. No. 9,166,150.

(51) Int. Cl.
*G11C 11/00* (2006.01)
*H01L 43/02* (2006.01)
(Continued)

(52) U.S. Cl.
CPC .............. *H01L 43/02* (2013.01); *G11C 11/155* (2013.01); *G11C 11/161* (2013.01); *H01L 27/228* (2013.01); *H01L 43/08* (2013.01); *H01L 43/10* (2013.01); *H01L 43/12* (2013.01)

(58) Field of Classification Search
CPC ..... G11C 11/155; G11C 11/161; G11C 11/00; G11C 11/16
USPC ......................................... 365/158, 163, 173
See application file for complete search history.

(56) References Cited

U.S. PATENT DOCUMENTS

| 7,067,866 B2 * | 6/2006 | Shi ..................... H01L 27/228 257/296 |
| 7,577,020 B2 | 8/2009 | Chung et al. |

(Continued)

FOREIGN PATENT DOCUMENTS

KR    10-2012-0055485 A    5/2012

OTHER PUBLICATIONS

International Search Report and Written Opinion mailed Sep. 27, 2013 for PCT/US2013/047395 filed Jun. 24, 2013.

(Continued)

*Primary Examiner* — Pho M Luu
(74) *Attorney, Agent, or Firm* — Blakely, Sokoloff, Taylor & Zafman LLP

(57) ABSTRACT

Spin transfer torque memory (STTM) devices incorporating a field plate for application of an electric field to reduce a critical current required for transfer torque induced magnetization switching. Embodiments utilize not only current-induced magnetic filed or spin transfer torque, but also electric field induced manipulation of magnetic dipole orientation to set states in a magnetic device element (e.g., to write to a memory element). An electric field generated by a voltage differential between an MTJ electrode and the field plate applies an electric field to a free magnetic layer of a magnetic tunneling junction (MTJ) to modulate one or more magnetic properties over at least a portion of the free magnetic layer.

17 Claims, 11 Drawing Sheets

(51) Int. Cl.
H01L 43/12 (2006.01)
H01L 43/08 (2006.01)
H01L 27/22 (2006.01)
G11C 11/155 (2006.01)
G11C 11/16 (2006.01)
H01L 43/10 (2006.01)

(56) References Cited

U.S. PATENT DOCUMENTS

| | | | |
|---|---|---|---|
| 7,598,579 B2 * | 10/2009 | Horng | H01L 43/12 257/421 |
| 7,683,447 B2 | 3/2010 | Wang et al. | |
| 8,592,927 B2 | 11/2013 | Jan et al. | |
| 8,836,056 B2 * | 9/2014 | Oguz | H01L 43/12 257/295 |
| 8,860,156 B2 * | 10/2014 | Beach | H01L 29/82 257/421 |
| 9,166,150 B2 * | 10/2015 | Doyle | H01L 43/12 |
| 2011/0044096 A1 | 2/2011 | Li | |
| 2012/0068286 A1 | 3/2012 | Hosotani et al. | |
| 2012/0282711 A1 | 11/2012 | Abedifard et al. | |
| 2012/0294077 A1 | 11/2012 | Liu et al. | |

OTHER PUBLICATIONS

Office Action and Taiwan Search Report from the Taiwan Intellectual Property Office for Taiwan Patent Application No. 102141484 dated Aug. 17, 2015 and English Translation thereof.

Notification of Concerning Transmittal International Preliminary Report on Patentability mailed Jul. 2, 2015 and International Preliminary Report on Patentability issued Jun. 23, 2015 which cites Written Opinion of the International Searching Authority mailed Sep. 27, 2015 which as previously submitted in the Information Disclosure Statement (IDS) dated Oct. 10, 2013 for PCT/US2013/047395.

"Voltage-induced Perpendicular Magnetic Anisotropy Change in Magnetic Tunnel Junctions," by Nozaki et al., Applied Physics Letters #96, 2010, 4 pages.

"Quantitative Evaluation of Voltage-induced Magnetic Anisotropy Change by Magnetoresistance Measurement," by Shiota et al., Applied Physics Express #4, 2011, 3 pages.

U.S. Appl. No. 13/627,968 titled "Perpendicular MTJ Stacks With Magnetic Anisotropy Enhancing Layer and Crystallization Barrier Layer," dated Sep. 26, 2012, 31 pages.

"Voltage-assisted Magnetization Switching in Ultrathin Fe80Co20 Alloy Layers," by Shiota et al., May 2009, 13 pages.

Second Office Action from the Examiner of the Intellectual Property Office (the IPO) for Taiwan Patent Application No. 102141484 dated May 5, 2016 and English Translation thereof.

Notice of Preliminary Rejection (Non-Final) from the Korean Intellectual Property Office (KIPO) for Koran Patent Application No. 10-2015-7011726 dated Jun. 17, 2016 and English Summary thereof.

* cited by examiner

ELECTRIC FIELD ENHANCED SPIN TRANSFER TORQUE MEMORY (STTM) DEVICE

This is a Continuation Application of Ser. No. 13/725,235 filed Dec. 21, 2012, now U.S. Pat. No. 9,166,150 issued on Oct. 20, 2015.

TECHNICAL FIELD

Embodiments of the invention are in the field of memory devices and, in particular, spin transfer torque memory (STTM) devices.

BACKGROUND

STTM devices are non-volatile memory devices that utilize a phenomenon known as tunneling magnetoresistance (TMR). For a structure including two ferromagnetic layers separated by a thin insulating tunnel layer, it is more likely that electrons will tunnel through the tunnel layer when magnetizations of the two magnetic layers are in a parallel orientation than if they are not (non-parallel or antiparallel orientation). As such, an MTJ can be switched between two states of electrical resistance, one state having a low resistance and one state with a high resistance.

For an STTM device, current-induced magnetization switching is used to set the bit states. Polarization states of one ferromagnetic layer are switched relative to a fixed polarization of the second ferromagnetic layer via the spin transfer torque phenomenon, enabling states of the MTJ to be set by application of current. Upon passing a current through the fixed magnetic layer, angular momentum (spin) of the electrons is polarized along the direction of the magnetization of the fixed layer. These spin polarized electrons transfer their spin angular momentum to the magnetization of the free layer and cause it to precess. As such, the magnetization of the free magnetic layer can be switched by a pulse of current (e.g., in about 1 nano-second) exceeding a certain critical value with magnetization of the fixed magnetic layer remaining unchanged as long as the current pulse is below a higher threshold attributable to a different geometry, an adjacent pinning layer, different coercivity ($H_c$), etc.

The critical value of current required for switching magnetization of the free layer, referred to herein as the "critical current," is a factor impacting the dimensions of a transistor coupled to the STTM device with larger critical currents requiring larger transistors, resulting in a larger footprint for a 1T-1 STTM element cell size, higher power consumption, etc. For STTM array capacity and power consumption to be competitive with other memory technologies, such as DRAM, a reduction in critical current is advantageous.

BRIEF DESCRIPTION OF THE DRAWINGS

Embodiments of the present invention are illustrated by way of example, and not limitation, in the figures of the accompanying drawings in which.

DETAILED DESCRIPTION

Figure 1A:
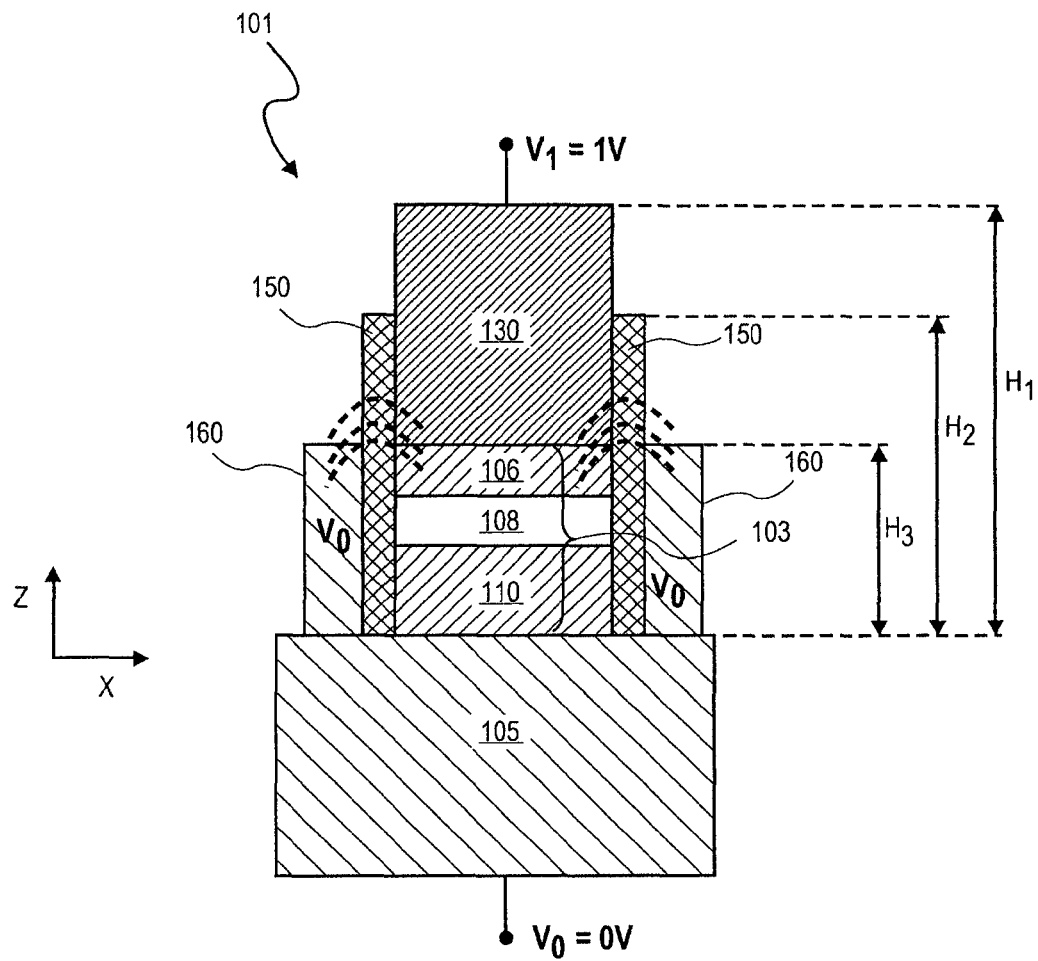
FIG. 1A illustrates a cross-sectional view of an STTM device including a field plate, in accordance with an embodiment of the present invention.

Described herein are voltage assisted STTM devices employing an electric field for a reduced critical current. In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer or component with respect to other layers or components. For example, one layer disposed over (above) or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Embodiments described herein include a spintronic device which generally utilizes not only current-induced magnetic field manipulation (spin transfer torque), but also an electric field induced manipulation of magnetic dipole orientation to set states in a magnetic device element (e.g., to write to a memory element). More specifically, a free magnetic layer of a magnetic tunneling junction (MTJ) is exposed to an electric field to modulate one or more magnetic properties (e.g., surface magnetic anisotropy, $K_s$) over at least a portion of the free magnetic layer so as to reduce the critical current required for spin transfer induced magnetization switching of the device element. Hence, embodiments of the spintronic devices described herein may be considered "electric field enhanced" spin transfer torque (EFESTT) devices.

As described further herein, EFESTT device embodiments generally utilize an electric field that is oriented non-parallel to a current passed through a free magnetic layer of an (MTJ) stack or element. This direction of applied electric field is in contrast to an "electric-field controlled" spintronic device which attempts to induce magnetization switching through application of an electric field parallel to direction of a current flow through an MTJ where the electric field is oriented in a direction across a thickness of a free magnetic layer and is substantially uniform across a diameter of the MTJ stack. Notably, developing an electric field parallel to the direction of a current flow through the MTJ stack that will extend into a free magnetic layer entails adding a dielectric insulator between the MTJ stack and contacts (e.g., between the free magnetic layer and a contact closest to the free magnetic layer) such that resistance between the contacts through the free magnetic layer becomes too great to permit current (DC) useful for spin transfer induced magnetization switching of the free magnetic layer. As such, electric field controlled spintronic devices are wholly dependent on electric-field induced magnetization switching, and face a number of resulting difficulties. The EFESTT device embodiments described herein however are not wholly dependent on electric-field induced magnetization switching and avoid the addition of an isolative dielectric layer in the MTJ stack or element. Hence, a current pulse can still be generated with a reasonably low voltage drop across contacts of the MTJ stack and utilized for spin transfer torque magnetization switching.

FIG. 1A illustrates a cross-sectional view of an STTM device 101 including a field plate 160, in accordance with an embodiment of the present invention. Generally, the STTM device 101 is a device suitable for magnetic storage (i.e., a spintronic memory element) and is illustrated in an advantageous vertical stack orientation although other orientations (horizontal, etc.) are also possible. Generally, the STTM device 101 includes an MTJ stack 103 disposed between fixed and free magnetic layer electrodes 105, 130, respectively. Notably, embodiments herein illustrate structures and techniques to enhance a STT device through application of an electric field that are broadly applicable to any MTJ stack known in the art applicable for an STT device. As such, while exemplary embodiments include a description of one advantageous MTJ stack 103 for the sake of clarity, embodiments of the invention are not limited to any one MTJ stack and instead may be readily adapted to one of the many variations known in the art. In the embodiment, the MTJ stack 103 includes a fixed magnetic layer 110, a tunneling layer 108 disposed over the fixed magnetic layer 110, and a free magnetic layer 106 disposed over the tunneling layer 108. In other embodiments, the order of the functional layers of the MTJ stack 103 is inverted. Furthermore, depending on the embodiment, the MTJ stack 103 may have either an in-plane anisotropic epitaxial structure or an out-of-plane, or "perpendicular," anisotropic epitaxial/textured structure.

Generally, the fixed magnetic layer 110 is composed of a material or stack of materials suitable for maintaining a fixed magnetization direction while the free magnetic layer 106 is composed of a magnetically softer material or stack of materials (i.e. magnetization can easily rotate to parallel and antiparallel state with respect to fixed layer). The tunneling layer 108 is composed of a material or stack of materials suitable for allowing current of a majority spin to pass through the layer, while impeding current of a minority spin (i.e., a spin filter).

In the exemplary embodiment, the MTJ stack 103 is based on a CoFeB/MgO system, having an MgO tunneling layer 108 and CoFeB layers 106, 110. In certain embodiments all layers of the MTJ stack 103 have (001) out-of-plane texture, where texture refers to the distribution of crystallographic orientations within the layers of the MTJ structure. For embodiments described herein, a high percentage of crystals of the CoFeB/MgO/CoFeB MTJ stack 103 have the preferred (001) out-of-plane orientation (i.e., the degree of texture is high) for a TMR ratio of at least 100%. In one advantageous CoFeB/MgO embodiment, the (001) oriented CoFeB magnetic layers 106, 108 are iron-rich alloys (i.e., Fe>Co), such as, but not limited to, $Co_{20}Fe_{60}B_{20}$. Other embodiments with equal parts cobalt and iron are also possible (e.g., $Co_{40}Fe_{40}B_{20}$), as are lesser amounts of iron (e.g., $Co_{70}Fe_{10}B_{20}$). In still other embodiments the tunneling layer 108 composition serves as a suitable texture template but is other than MgO, for example aluminum oxide ($AlO_x$).

The tunneling layer 108 may have a thickness up to 2 nm, however resistance for a given device area generally increases exponentially with tunneling layer thickness. In exemplary MgO embodiments thicknesses below 1 nm provide advantageously low resistance with thickness between 1 nm and 1.3 nm also providing acceptably low resistance. Thickness of the fixed magnetic layer 106 may also vary considerably, for example between 1 nm and 2 nm. In embodiments, the thickness of the free magnetic layer 106 is over 1 nm (e.g., at least 1.1 nm) and exemplary iron-rich CoFeB embodiments of the free magnetic layer 106 have a thickness between 1.3 nm and 2 nm. This greater thickness improves thermal stability of the free magnetic layer 106, enabling longer non-volatile lifetimes of an STTM device relative to a free magnetic layer of lesser thickness.

Although for the exemplary embodiment, the MTJ stack 103 is disposed directly on the electrode 105 (e.g., with CoFeB fixed magnetic layer 106 directly on a Ta layer), it is noted again that an MTJ stack may vary considerably without deviating from the scope of the embodiments of the present invention, for example, including one or more intermediate layer may be disposed between the fixed magnetic layer 110 and the electrode 105. For example, an anti-ferromagnetic layer, such as, but not limited to, iridium manganese (IrMn) or platinum manganese (PtMn), or a synthetic antiferromagnetic (SAF) structure including such an anti-ferromagnetic layer, adjacent to another ferromagnetic layer (e.g., CoFe) with a nonmagnetic spacer layer, such as, but not limited to Ru, intervening between the fixed magnetic layer 106 and the SAF, may be present for various purposes, such as pinning an interface of the fixed magnetic layer 110 (e.g., through exchange-bias coupling).

Electrically connected to the MTJ stack 103 are the electrodes 105 and 130. The electrodes 105 and 130 are each of a material or stack of materials operable for electrically contacting magnetic electrodes of a STTM device, and may be any material or stack of materials known in the art for such a purpose. Although the electrodes 105, 130 may have a range of layer thicknesses (e.g., 5 nm-50 nm) and include a variety of materials to form a compatible interface with both the MTJ stack 103 and interconnects, in the exemplary embodiment the fixed magnetic layer electrode 105 includes at least a tantalum (Ta) layer and may further include an additional underlying conductive buffer including at least one ruthenium (Ru) layer and a second Ta layer. For the free magnetic layer (top) electrode 130, a metal having high conductivity even if oxidized at the surface is advantageous, such as, but not limited to, Cu, Al, Ru, Au, etc, with Ru advantageously providing a good barrier of oxygen, reducing the possibility of oxidation within the MTJ stack 103.

As shown in FIG. 1A, the MTJ stack 103 is surrounded by a dielectric layer 150. While the dielectric layer 150 may be generally be any conventional dielectric material, such as but not limited to, silicon dioxide, silicon nitride, silicon oxynitride, in advantageous embodiments, the dielectric layer 150 is a high-k dielectric material having a bulk dielectric constant greater than at least 8, advantageously greater than 10, and more advantageously greater than 15. Such a high dielectric constant is advantageous for increasing the strength of the electric field developed between the field plate 160 and the MTJ electrode (e.g., free magnetic layer electrode 130) through a reduction in the thickness of the dielectric layer 150 (in x-dimension of FIG. 1A). Where the STTM device 101 is disposed on a same substrate as a drive transistor (e.g., in a 1-transistor spin transfer torque memory cell, such as that depicted in FIG. 6), the dielectric layer 150 is of the same dielectric material (and potential same thickness) as a gate dielectric utilized in the transistor). Exemplary materials include metal oxides, such as, but not limited to hafnium oxide ($HFO_2$), zirconium oxide ($ZrO_2$), and the like. For such high-k embodiments, the dielectric layer 150 may have a thickness (x-dimension in FIG. 1A) below 2 nm and more specifically anywhere between 1 nm and 2 nm. As further shown in FIG. 1A, the vertical height ($H_2$) of the dielectric layer that is no greater than the vertical z-height ($H_1$) of a top surface of the free magnetic layer electrode 130, permitting a routing metallization to contact the electrode 130. The dielectric layer 150 should further have a vertical height that is at least equal to that of free magnetic layer 106 and more particularly at least equal to a height of the MTJ stack 103 for those embodiments where the free magnetic layer 106 is disposed over the fixed magnetic layer 110, as illustrated in FIG. 1A.

The field plate 160 is a conductive material that is disposed proximate to the free magnetic layer 106, but separated from the magnetic layer 106, and/or MTJ stack 103, by the intervening dielectric layer 150. Functionally, the field plate 160 is to enable application a voltage differential between the field plate 160, which is shorted to a first electrode of the MJT stack 103 during operation of the device 101, and a second electrode of the MJT stack 103 so as to drop a voltage across the dielectric layer 150 and develop an electric field (including fringing field, which may be significant at the geometries typical of MTJ stacks) that extends into at least a portion of the free magnetic layer 106. While generally the field plate 160 may be of any conductive material, including doped semiconductors such as, but not limited to, polysilicon, in the exemplary embodiment the field plate 160 is a metal, such as but not limited to one or more of the metals present in one or more of the electrodes 105, 130 (e.g., Ta, Ru, Au), or other metal such Al, Cu. The field plate 160 may have a vertical height selected to direct the electric field through the free magnetic layer 106 as desired and is therefore a design variable dependent on implementation. Generally, as shown in FIG. 1A, the field plate 160 may have a vertical height that is less than the vertical height of the dielectric layer 150 so as to ensure electrical isolation from the electrode 130. In certain embodiments, the vertical height of the field plate is approximately equal to the vertical height of the MTJ stack ($H_3$), which places the field plate 160 in close proximity to the free magnetic layer 106 and free magnetic layer electrode 130.

As shown in FIG. 1A, with the field plate 160 adjacent to a sidewall of the MTJ stack 103, electric field lines (dashed lines) extend between the MTJ electrode that is in closest proximity to the free magnetic layer 106 and the field plate 160. The strength and direction of the these electric field lines may be manipulated through design of the dielectric layer 150 and the field plate 160, independent of the MTJ stack 103, and further through manipulation of the differential voltage applied between the electrode 130 and the field plate 160. Notably, the direction of the electric field may vary with changes in geometry of the field plate 160 and/or dielectric layer 150 relative to that of the MTJ stack 103. Nonetheless, because the field plate 160 is disposed outside of a conductive path through the MTJ stack 103 (between the electrodes 105 and 130), the electric field is non-parallel to the conductive path, or direction of current flow, through the MTJ stack 103. Where resistance of the free magnetic layer 106 is greater than that of the electrode 130, which is typically the case (e.g., CoFeB films have a resistivity in the hundreds to many thousands cm μΩ, often increasing as layer thickness is reduced due to morphology changes), the electric field extends through peripheral portions of the free magnetic layer 106 disposed closest to the field plate 160. In certain such embodiments, the field is substantially orthogonal to the direction of the conductive path through the MTJ stack 103 within one or more regions of the free magnetic layer 106. The extent and location of such regions where an orthogonal field is present may be readily modeled for a given device geometry.

In the exemplary embodiment illustrated in FIG. 1A, the field plate 160 is operable as an extension of one of two MTJ electrodes 105, 130. The field plate 160 is directly connected to (e.g., disposed in direct ohmic contact) the MTJ electrode 105 and therefore maintained at a first voltage potential equal to that of the MTJ electrode 105 (e.g., 0V) while the other MTJ electrode (e.g., free magnetic layer electrode 130) is maintained at a second voltage potential (e.g., 1V). Hence, the electric field developed across at least a portion of the free magnetic layer 106 is a function of the voltage applied and/or current driven across the MTJ electrodes 105, 130. As such, the thickness of the dielectric layer 150 and position of the field plate 160 relative to the free magnetic layer 106 may be determined based on the critical current to be passed through the MTJ stack 103 to switch the magnetization state, with the resulting electric field having an impact (e.g., a reduction) on the magnitude of the critical current in the manners further illustrated by FIGS. 2A-2D and 3A-3D.

Figure 1B:
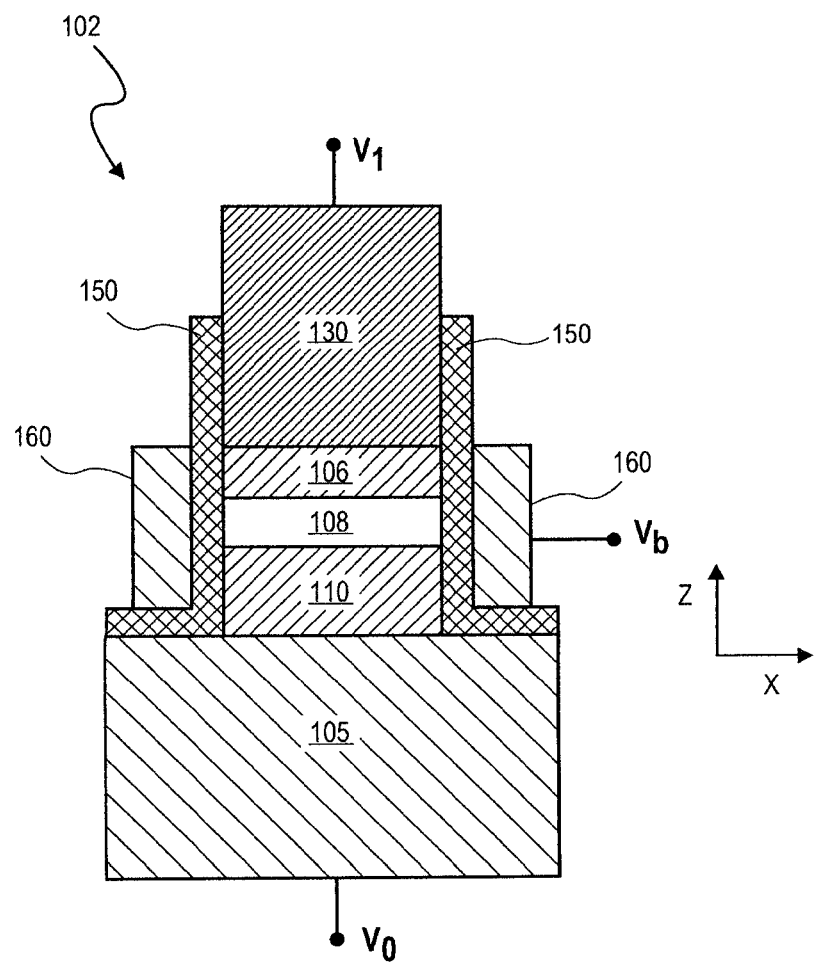
FIG. 1B illustrates a cross-sectional view of an STTM device including a field plate, in accordance with an embodiment of the present invention.

In another embodiment illustrated in FIG. 1B, the field plate 160 is electrically isolated (e.g., by the dielectric layer 150) from both the MTJ electrodes 105, 130. As such, the field plate is operable as a third independent terminal of the STTM device 101. As a third independent terminal, any differential voltage sustainable by the dielectric layer 150 (e.g., below the dielectric breakdown voltage) may be provided by a bias voltage ($V_b$) independent of a current driving voltage applied between the MTJ electrodes 105 and 130 at the voltage potentials $V_0$ and $V_1$ utilized to induce a critical current through the free magnetic layer 106. Noting the tunneling layer 108 may limit the voltage level differential sustainable between the MTJ electrodes 105 and 130, as an electric field is also developed across the tunneling layer 108, higher voltages, and hence stronger electric fields may be achieved with embodiments utilizing an electrically independent field plate 160 as depicted in FIG. 1B.

Figure 2A:
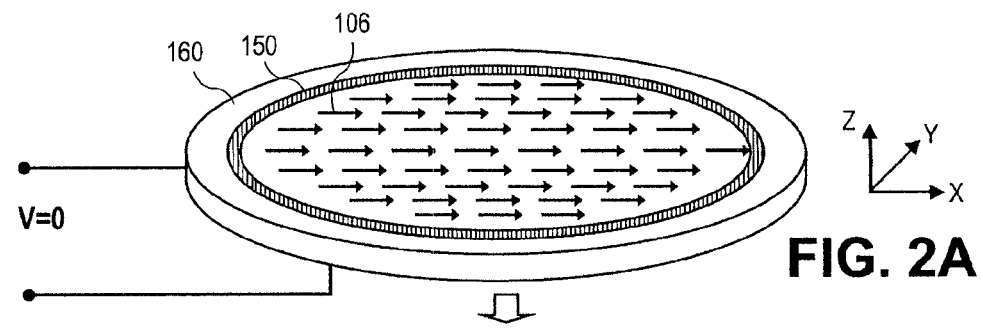
FIGS. 2A, 2B, 2C, and 2D illustrate isometric views of a transverse section of an STTM device including a field plate as polarization states of a parallel magnetic layer are switched, in accordance with an embodiment.

FIGS. 2A-2D illustrate isometric views of a transverse section of an STTM device including a field plate as polarization states of a parallel magnetic layer are switched, in accordance with an embodiment, while FIGS. 3A-3D illustrate isometric views of a transverse section of an STTM device including a field plate as polarization states of a perpendicular magnetic layer are switched, in accordance with another embodiment. As shown in these Figures, the field plate 160 forms a perimeter surrounding the dielectric layer 150, that further forms an annulus surrounding the section of the free magnetic layer 106. As illustrated in FIG. 2A, at an initial state, magnetization dipoles within the free magnetic layer 106 are substantially aligned in a first direction along the x-axis with a 0 volt differential between the field plate 160 and the free magnetic layer electrode (not visible in FIG. 2A, but connected to the free magnetic layer 106 just as the electrode 130 in FIG. 1A).

Figure 2B:
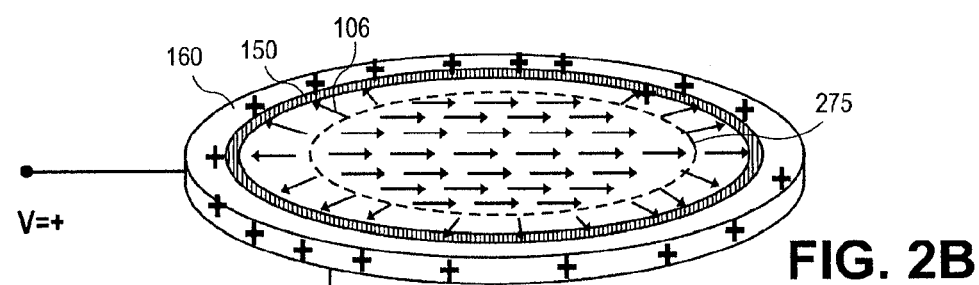

For the state illustrated in FIG. 2B, a voltage differential is applied between the field plate 160 and the free magnetic layer electrode (e.g., +voltage applied to the field plate 160 with the free magnetic layer electrode unbiased or at a negative voltage as for the exemplary embodiment where the field plate 160 is electrically tied to the fixed magnetic layer electrode potential). The voltage differential develops an electric field extending into at least a peripheral region 275 of the free magnetic layer 106. As the field plate 160 forms a perimeter around the free magnetic layer 106, the peripheral region 275 is annular and the electric field interacts with magnetic dipoles within the annular peripheral region 275, orienting them (radially) away from their initial (preferred) orientation.

Figure 2C:
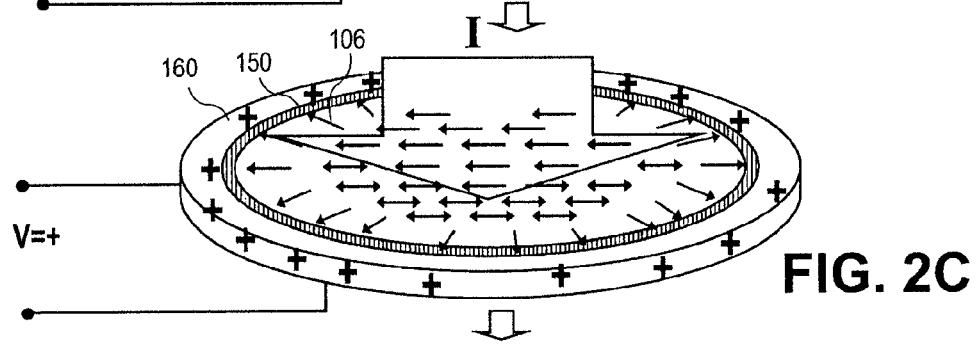
Figure 2D:
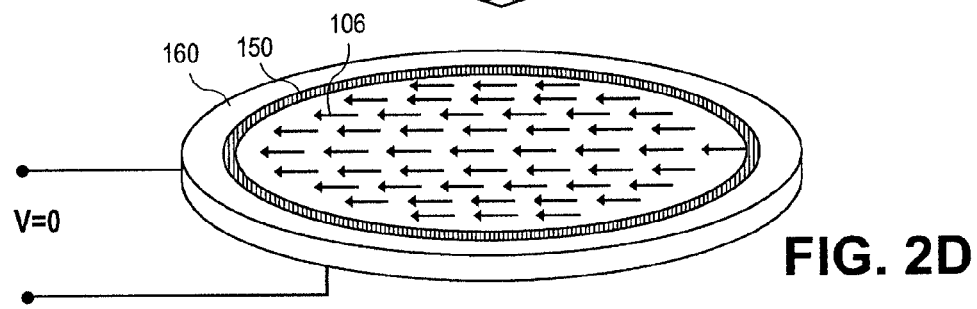

Next, as illustrated in FIG. 2C, a critical current (I) is passed through the free magnetic layer 106 while the field plate 160 is biased relative to the free magnetic layer electrode. Application of the critical current I may be substantially instantaneous with the application of the voltage differential between the field plate 160 and free magnetic layer electrode (e.g., where the field plate 160 is electrically tied to the fixed magnetic layer electrode potential) such that the states illustrated in FIGS. 2B and 2C are not readily distinguished. Alternatively, the states illustrated in FIGS. 2B and 2C may be distinct for embodiments where the field plate 160 can be independently biased, as further described elsewhere in reference to FIG. 1B. For certain such embodiments, it may further be possible to remove the bias from the field plate before application of the critical current I. FIG. 2C illustrates a transfer torque induced magnetization switching to a second in-plane direction. Because dipoles within the peripheral region 275 (i.e., edge) are already out of the preferred orientation, the current (density) needed to pass through the MTJ to switch the magnetization is effectively reduced relative to what would be required to switch the magnetization from the initial state depicted in FIG. 2A. As such, the application of the electric field illustrated in FIG. 2B serves to enhance the transfer torque induced magnetization switching illustrated in FIG. 2C. Finally, with the state of the MTJ stack switched, the electric field (and critical current) is removed, as shown in FIG. 2D.

Figure 3A:
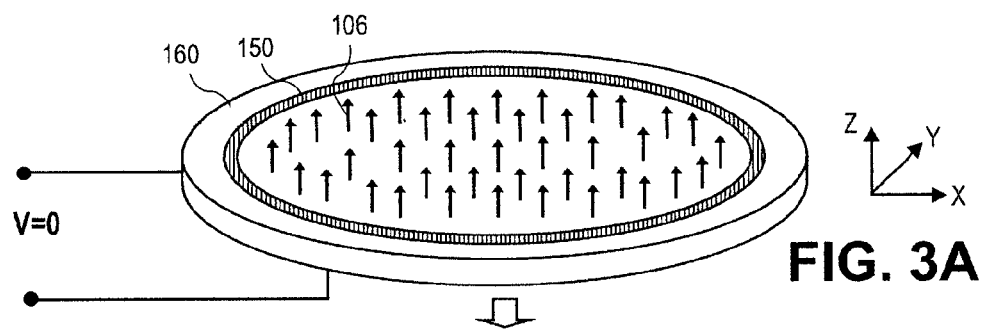
FIGS. 3A, 3B, 3C, and 3D illustrate isometric views of a transverse section of an STTM device including a field plate as polarization states of a perpendicular magnetic layer are switched, in accordance with an embodiment.
Figure 3B:
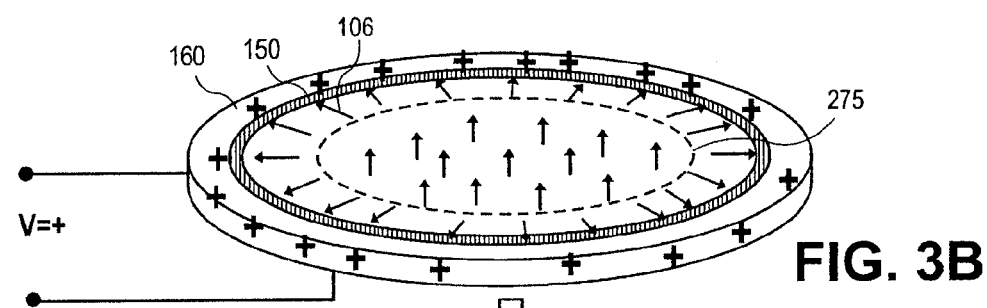
Figure 3C:
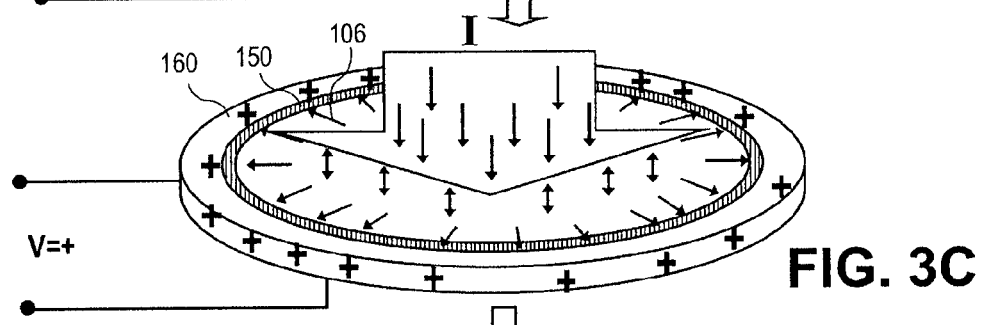
Figure 3D:
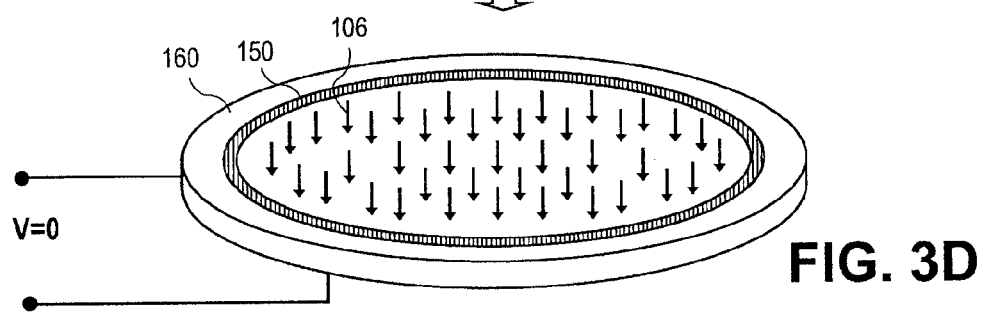

While FIGS. 2A-2D illustrate electric field enhanced spin transfer torque induced magnetization switching for an MTJ stack including a free magnetic layer with in-plane magnetic anisotropy, FIGS. 3A-3D illustrated the same for an MTJ stack including a free magnetic layer with perpendicular magnetic anisotropy. As shown in FIG. 3A, the field plate 160 and dielectric layer 150 form the same perimeter structures surrounding the free magnetic layer 106 as was illustrated in FIG. 2A. The initial magnetization state of the free magnetic layer 106 is in a first out-of-plane direction. In FIG. 3B, a bias is applied between the field plate 160 and the free magnetic layer electrode (e.g., +bias to the field plate 160) and the dipoles within the peripheral zone 275 lose their preferred orientation. In FIG. 3C, the critical current I is passed through the MTJ stack and transfer torque induced magnetization switching occurs to reorient the dipoles into a second out-of-plane direction. The electric field (and critical current) is then removed in FIG. 3D.

Figure 4:
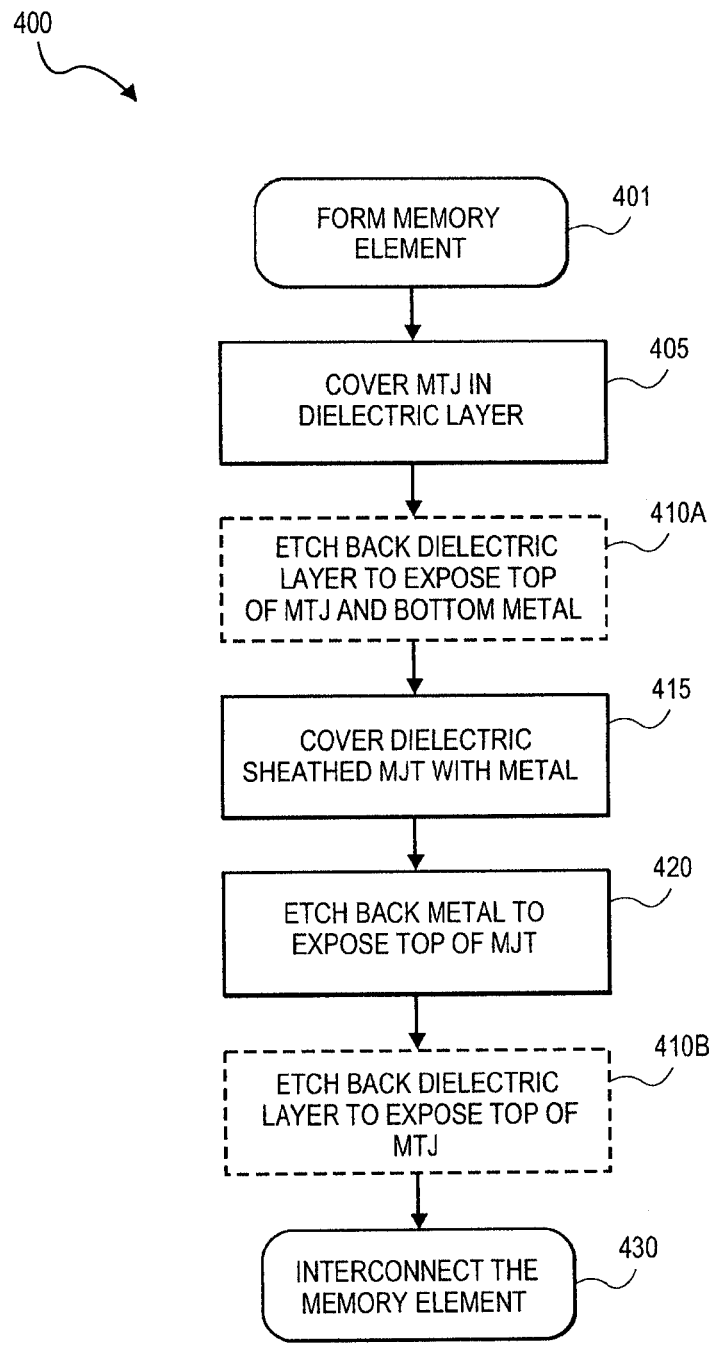
FIG. 4 is a flow diagram illustrating a method of fabricating a STTM device including a field plate, in accordance with an embodiment.

FIG. 4 is a flow diagram illustrating a method 400 of fabricating a STTM device including a field plate, in accordance with an embodiment. FIGS. 5A, 5B, 5C, 4D, and 5E illustrate isometric views of a STTM device including a field plate as operations in the method of FIG. 4 are performed, in accordance with an embodiment.

Figure 5A:
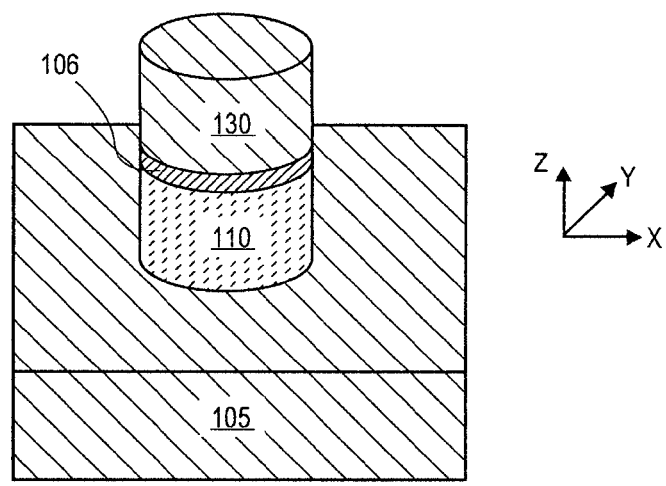
FIGS. 5A, 5B, 5C, 5D, and 5E illustrate isometric views of a STTM device including a field plate as operations in the method of FIG. 4 are performed, in accordance with an embodiment.

The method 400 begins with forming the memory element by depositing an MTJ stack on a substrate (e.g., silicon or other semiconductor wafer, etc.) at operation 401. FIG. 5A illustrates an exemplary MTJ stack comprising the fixed magnetic layer electrode 105, the fixed magnetic layer 110 over (e.g., directly on) the fixed magnetic layer electrode 105, the free magnetic layer 106 over the fixed magnetic layer 110 (with a tunneling layer disposed there between but not depicted), and the free magnetic layer electrode 130 over (e.g., directly on) the free magnetic layer 106. Any conventional techniques may be applied at operation 401 to form any conventional MTJ stack, such as but not limited to, deposition (e.g., sputter), patterning (e.g., lithographic) and etch (e.g., dry or wet) processes known in the art for the materials particular to the MTJ stack. As illustrated in FIG. 5A, patterning of the MTJ stack stops on the fixed magnetic layer electrode 105 such that the MTJ stack forms a memory element extending vertically from the electrode 105 with the electrode 105 extending laterally beyond the MTJ stack.

Figure 5B:
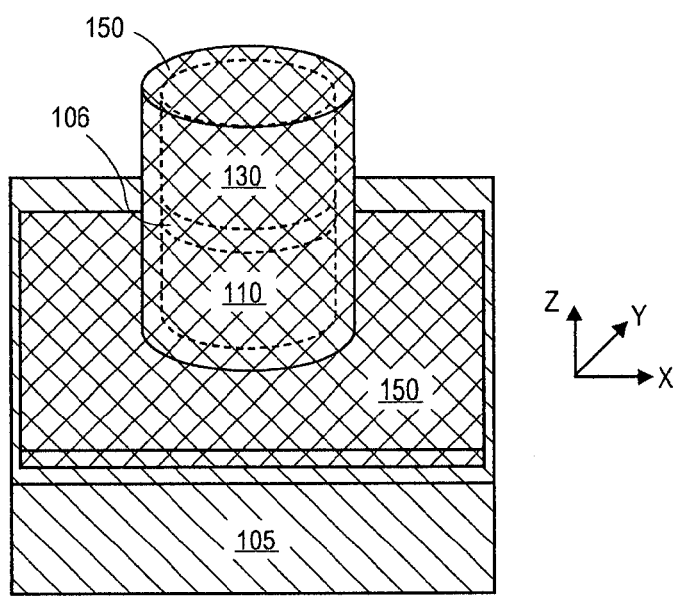

Referring again to FIG. 4, the method 400 proceeds to operation 405 where the MTJ stack is covered in a dielectric layer, as further illustrated in FIG. 5B. As shown, the dielectric layer 150 forms a substantially conformal layer having a controllable thickness on the substantially vertical sidewall of the MTJ stack. While any conventional deposition technique known in the art for the chosen dielectric (e.g., CVD for silicon dioxide) may be utilized at operation 405, in the exemplary embodiment an atomic layer deposition process (ALD) is utilized, for example to deposit a high-k dielectric layer (e.g., $HfO_2$).

Figure 5C:
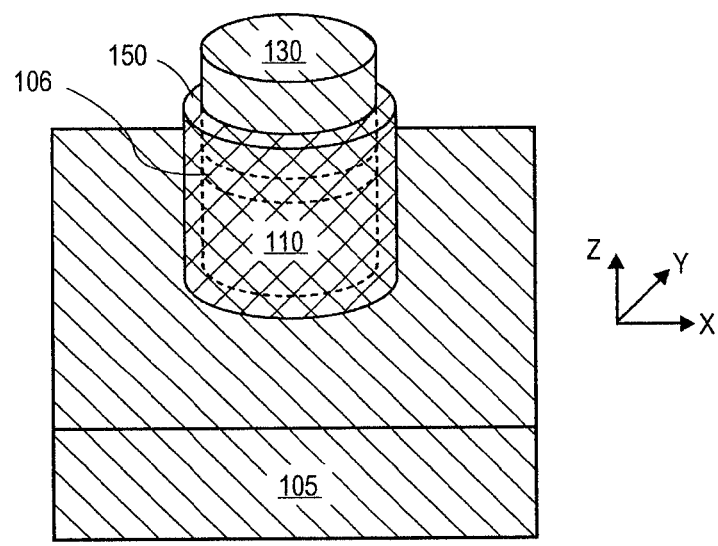

Returning to FIG. 4, the method 400 continues either at operation 410A where the dielectric layer 150 is etched back to expose the MTJ and a portion of the electrode 105, as further depicted in FIG. 5C, or the method 400 may alternatively delay the etchback until after a field plate is formed to electrically isolate the field plate from both electrodes (e.g., to form the structure illustrated in FIG. 1A). Where the operation 410A is performed, any anisotropic etch process (e.g., dry plasma etch) known in the art for the material chosen as the dielectric layer 150 may be utilized to self-alignedly (i.e., without a preliminary mask patterning operation) form a dielectric spacer along the sidewalls of the MTJ stack. As further shown in FIG. 5C, the etch back of the dielectric exposes both the electrodes 105 and 130, which are of material(s) resistant to the etch process employed at operation 410.

Figure 5D:
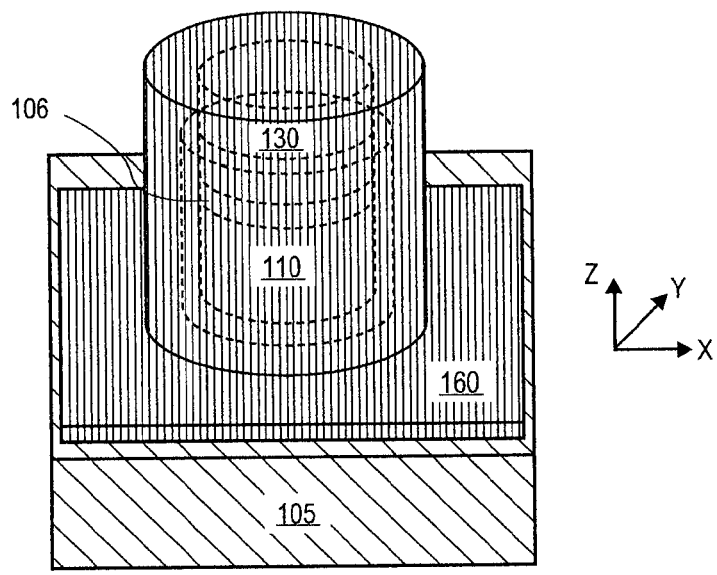

The method 400 (FIG. 4) then proceeds to operation 415 where a layer of conductive material for the field plate 160 is deposited over the dielectric layer 150 and the MTJ stack, as is further depicted in FIG. 5D. While any conventional deposition technique known in the art for the chosen material may be utilized at operation 415, in the exemplary embodiment ALD is utilized to deposit a highly conformal metal layer. In the exemplary embodiment where the conductive material makes contact with the electrode 105, the conductive material composition is chosen to make ohmic contact with the electrode 105. Alternatively, the electrode 105 may be utilized to plate up a metal electrolytically, or a catalytic layer may be deposited (e.g., sputtered) and utilized to electrolessly plate up a metal.

Figure 5E:
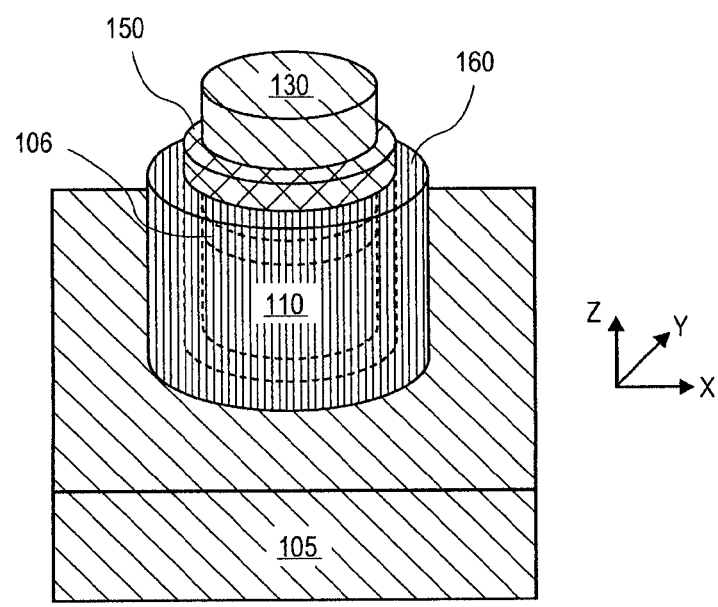

As further depicted in FIG. 4, at operation 420 the conductive (e.g., metal) layer is etched back, again advantageously with a self-aligned (unpatterned) anisotropic etch process to form a conductive (metal) spacer surrounding the dielectric layer 150, as shown in FIG. 5E. During the field plate etch back operation, the MTJ electrode 130 is exposed (being resistant to the etch processing employed in the etchback operation 420). As is further shown in FIG. 5D, the duration of the etch back process can be tuned to leave the field plate 160 with a desired height (e.g., approximately that of the dielectric layer 150) that is advantageously not recessed below (or far below) the free magnetic layer 106. Following operation 420, the method 400 completes with interconnecting the memory element using conventional techniques unless the dielectric etchback operation 410A was not performed, in which case the dielectric etchback operation 410B is performed prior to (or as part of) operation 430 to expose the electrode 130 for interconnection.

Figure 6:
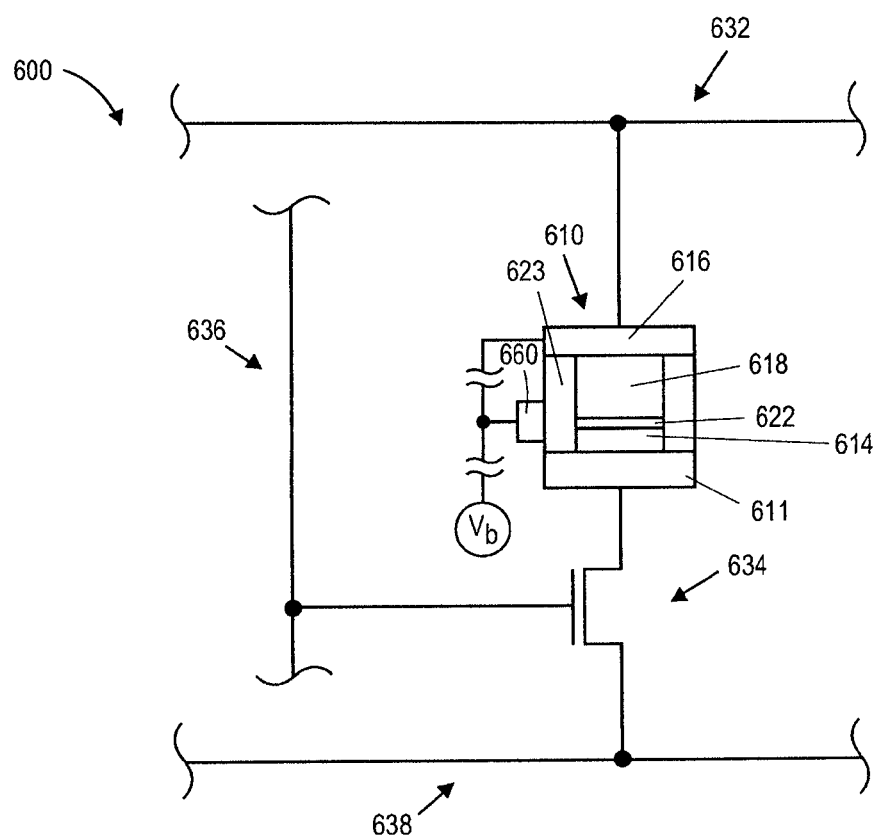
FIG. 6 illustrates a schematic of a STTM bit cell which includes a spin transfer torque element, in accordance with an embodiment of the present invention.

FIG. 6 illustrates a schematic of a STTM bit cell which includes a spin transfer torque element, in accordance with an embodiment of the present invention. The spin transfer torque element 610 includes: a free magnetic layer electrode 611; a free magnetic layer 614 proximate to the free magnetic layer electrode 611; a fixed magnetic layer electrode 616 proximate to a fixed magnetic layer 618; and a tunneling layer 622 disposed between the free magnetic layer 614 and the fixed magnetic layer 618, to complete the MTJ structure. A dielectric element 623 is disposed adjacent the fixed magnetic layer electrode 616, the fixed magnetic layer 618, and the tunneling layer 622 with a field plate 660 disposed adjacent to the second dielectric element 623. The fixed magnetic layer electrode metallization 616 is electrically connected to a bit line 632. The free magnetic layer electrode metallization 611 is connected to a transistor 634. The transistor 634 is connected to a word line 636 and a source line 638 in any manner conventional in the art. The field plate 660 is connected to either the fixed magnetic layer electrode metallization 616 or, alternatively, to an independent bias voltage ($V_B$) for electric field enhancement of the STTM bit cell 600. The STTM bit cell 600 may further include additional read and write circuitry (not shown), a sense amplifier (not shown), a bit line reference (not shown), and the like, as is understood by those skilled in the art of solid state non-volatile memory devices, for the operation of the STTM bit cell 600. It is to be understood that a plurality of the STTM bit cell 600 may be operably connected to one another to form a memory array (not shown), wherein the memory array can be incorporated into a non-volatile memory device.

Figure 7:
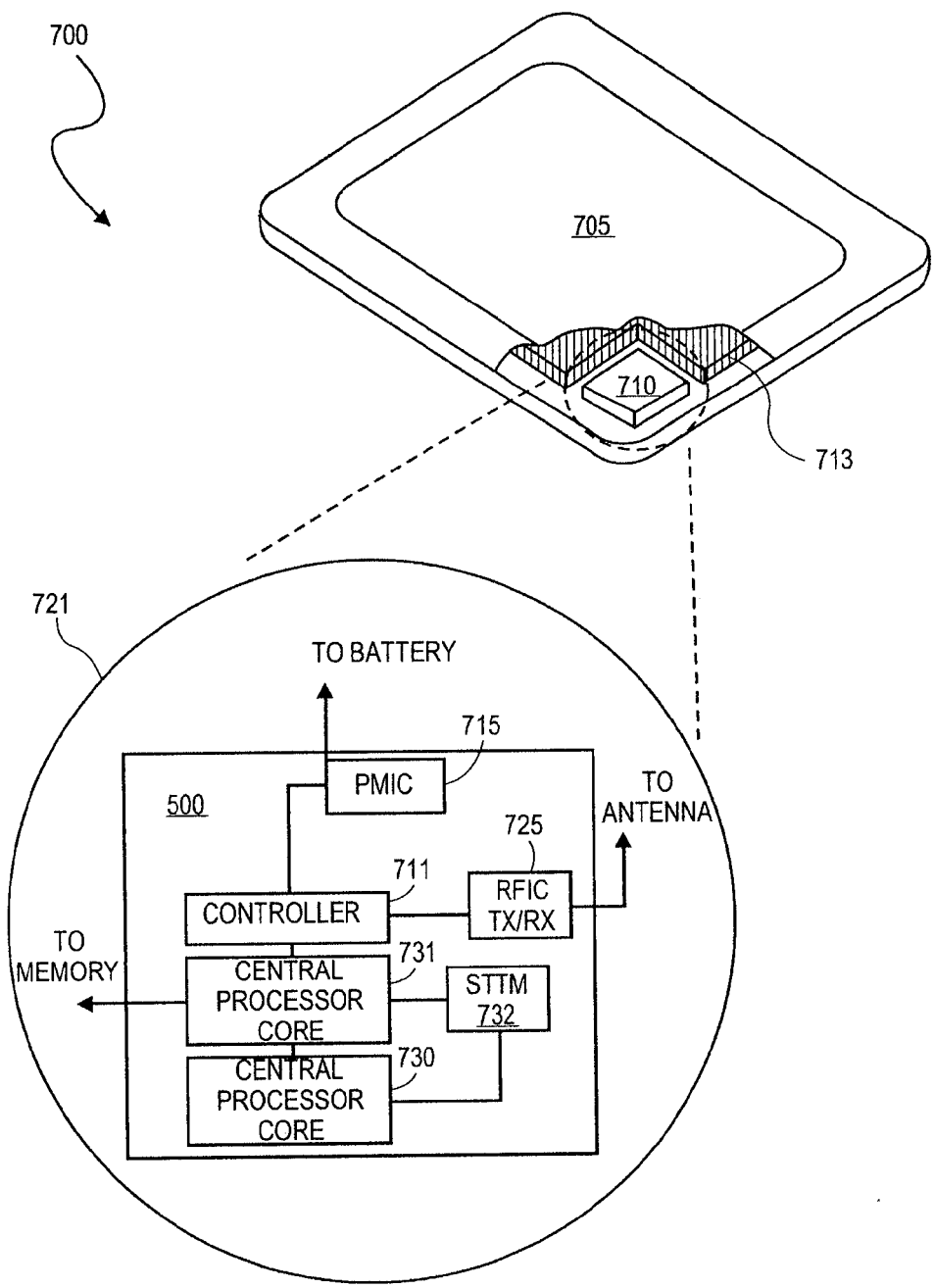
FIG. 7 illustrates an isometric view of a mobile computing device platform and schematic view of a microelectronic device employed by the mobile platform, in accordance with an embodiment of the present invention.

FIG. 7 illustrates an isometric view of a computing device platform 700 and schematic view 721 of a microelectronic device 710 employed by the platform, in accordance with an embodiment of the present invention. The computing platform 700 may be any portable device configured for each of electronic data display, electronic data processing, and wireless electronic data transmission, or stationary device such as a desktop computer, or server appliance configured for at least electronic data processing. For exemplary mobile embodiments, the computing platform 700 may be any of a tablet, a smart phone, laptop or ultrabook computer, etc., and include a display screen 705 that may be a touchscreen (capacitive, inductive, resistive, etc.), a chip-level (SoC) or package-level integrated microelectronic device 710, and a battery 713.

The integrated device 710 is further illustrated in the expanded view 721. In the exemplary embodiment, the device 710 includes at least one memory at least one processor chip (e.g., a multi-core microprocessor and/or graphics processor cores 730, 731). In embodiments, an electric field enhanced STTM 732, as described in more detail elsewhere herein (e.g., FIGS. 1A, 1B, etc.), is integrated into the device 710. The device 710 is further coupled to the board, substrate, or interposer 500 along with, one or more of a power management integrated circuit (PMIC) 715, RF (wireless) integrated circuit (RFIC) 725 including a wideband RF (wireless) transmitter and/or receiver (e.g., including a digital baseband and an analog front end module further comprises a power amplifier on a transmit path and a low noise amplifier on a receive path), and a controller thereof 711. Functionally, the PMIC 715 performs battery power regulation, DC-to-DC conversion, etc., and so has an input coupled to the battery 713 and with an output providing a current supply to all the other functional modules. As further illustrated, in the exemplary embodiment the RFIC 725 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In implementations, each of these modules may be integrated onto a single chip as an SoC, onto separate ICs coupled to a package substrate of the packaged device 710, or at a board level.

Figure 8:
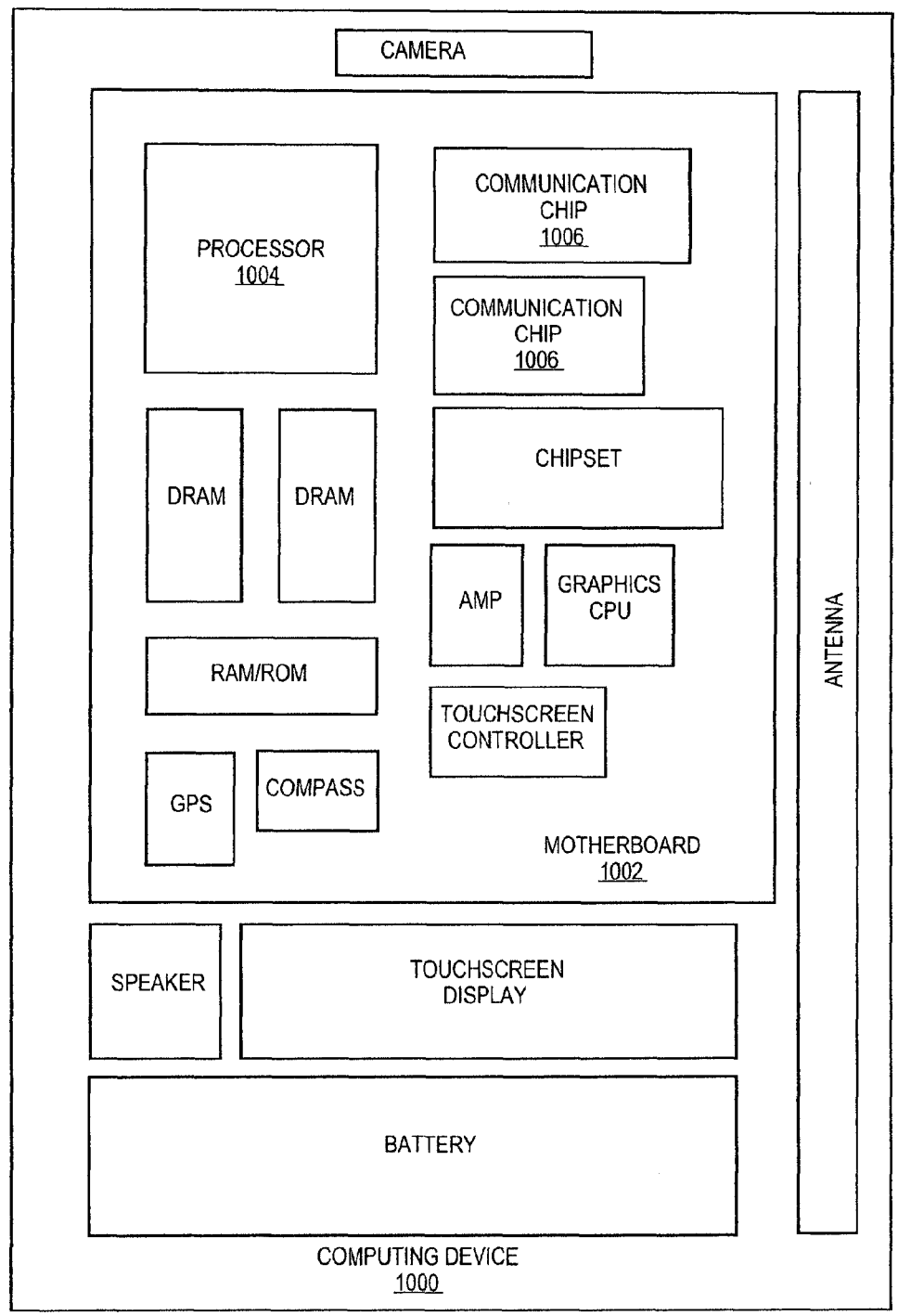
FIG. 8 illustrates a functional block diagram of computing device in accordance with one implementation of the invention.

FIG. 8 is a functional block diagram of a computing device 1000 in accordance with one embodiment of the invention. The computing device 1000 may be found inside the platform 700, for example, and further includes a board 1002 hosting a number of components, such as but not limited to a processor 1004 (e.g., an applications processor) and at least one communication chip 1006. In embodiments, at least the processor 1004 is integrated (e.g., on-chip) with an electric field enhanced STTM in accordance with embodiments describe elsewhere herein. The processor 1004 is physically and electrically coupled to the board 1002. The processor 1004 includes an integrated circuit die packaged within the processor 1004. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

It is to be understood that the above description is intended to be illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. An electric field enhanced spin torque transfer memory device, comprising:
   a first electrode;
   a fixed magnetic layer disposed above the first electrode;
   a tunneling layer disposed above the fixed magnetic layer;
   a free magnetic layer disposed above the tunneling layer, the free magnetic layer having a height above the first electrode;
   a second electrode disposed above the free magnetic layer;
   a dielectric layer adjacent to a sidewall of each of the fixed magnetic layer, the tunneling layer, the free magnetic layer, and a portion of the second electrode, the dielectric layer having a height above the first electrode; and
   a field plate disposed adjacent the dielectric layer and separated from the fixed magnetic layer, the tunneling layer, the free magnetic layer, and the second electrode by the dielectric layer, wherein the field plate has a height above the first electrode, the height of the field plate below the height of the dielectric layer and not substantially below the height of the free magnetic layer.

2. The device of claim 1, wherein the height of the field plate is not below the height of the free magnetic layer.

3. The device of claim 1, wherein the height of the field plate is approximately the same as the height of the free magnetic layer.

4. The device of claim 1, wherein a current flow is through a thickness of the free magnetic layer.

5. The device of claim 1, wherein the field plate is to apply an electric field between the field plate and the second electrode, the electric field having a component non-parallel to the direction of a current passed through the free magnetic layer.

6. The device of claim 1, wherein the field plate is a conductor maintained at a voltage potential equal to that of the first electrode with an applied electric field being a function of a differential in voltages applied to the first and second electrode and wherein the differential in voltages drives a current between the first and second electrodes through the free magnetic layer.

7. The device of claim 1, wherein the field plate is disposed in direct contact with the first electrode.

8. The device of claim 7, wherein the fixed magnetic layer, the dielectric layer, and the field plate are all disposed on the first electrode.

9. The device of claim 1, wherein the dielectric layer is a high-k dielectric having a dielectric constant greater than 8, and wherein the field plate and the first electrode are both metals.

10. The device of claim 1, further comprising a transistor electrically connected to the first or the second electrode, a source line, and a word line.

11. A method of fabricating an electric field enhanced spin torque transfer memory device, the method comprising:
    forming a first electrode;
    forming a fixed magnetic layer above the first electrode;
    forming a tunneling layer above the fixed magnetic layer;
    forming a free magnetic layer above the tunneling layer, the free magnetic layer having a height above the first electrode;
    forming a second electrode above the free magnetic layer;
    forming a dielectric layer adjacent to a sidewall of each of the fixed magnetic layer, the tunneling layer, the free magnetic layer, and a portion of the second electrode, the dielectric layer having a height above the first electrode;
    forming a conductive layer over the dielectric layer; and
    forming a field plate by recessing the conductive layer to a height above the first electrode, the height of the recessed conductive layer below the height of the dielectric layer but not substantially below the height of the free magnetic layer, wherein the field plate is formed adjacent the dielectric layer and separated from the fixed magnetic layer, the tunneling layer, the free magnetic layer, and the second electrode by the dielectric layer.

12. The method of claim 11, wherein forming the field plate comprises recessing the conductive layer to a height that is not below the height of the free magnetic layer.

13. The device of claim 11, wherein forming the field plate comprises recessing the conductive layer to a height that is approximately the same as the height of the free magnetic layer.

14. The method of claim 13, wherein recessing the conductive layer comprises etching the conductive layer.

15. The method of claim 11, wherein forming the dielectric layer comprises depositing a high-k dielectric material by atomic layer deposition (ALD), and etching back the dielectric layer by anisotropically etching the dielectric layer.

16. The method of claim 11, wherein forming the conductive layer comprises depositing a metal by a process selected from the group consisting of CVD, ALD, electrolytic plating, and electroless plating.

17. The method of claim 11, wherein forming the fixed magnetic layer comprises depositing CoFeB, and wherein forming the tunneling layer comprises depositing MgO.

* * * * *